United States Patent
Machkaoutsan et al.

(10) Patent No.: US 8,367,548 B2
(45) Date of Patent: Feb. 5, 2013

(54) STABLE SILICIDE FILMS AND METHODS FOR MAKING THE SAME

(75) Inventors: Vladimir Machkaoutsan, Leuven (BE); Ernst H. A. Granneman, Hilversum (NL)

(73) Assignee: ASM America, Inc., Tucson, AZ (US)

( * ) Notice: Subject to any disclaimer, the term of this patent is extended or adjusted under 35 U.S.C. 154(b) by 54 days.

(21) Appl. No.: 12/035,373

(22) Filed: Feb. 21, 2008

(65) Prior Publication Data
US 2008/0224317 A1 Sep. 18, 2008

Related U.S. Application Data

(60) Provisional application No. 60/918,342, filed on Mar. 16, 2007.

(51) Int. Cl.
*H01L 21/44* (2006.01)
(52) U.S. Cl. .......... 438/682; 257/E21.296; 257/E23.141
(58) Field of Classification Search .......... 257/E21.296, 257/754, E23.141; 438/682
See application file for complete search history.

(56) References Cited

U.S. PATENT DOCUMENTS

| | | | |
|---|---|---|---|
| 4,521,952 A | 6/1985 | Riseman | |
| 4,605,947 A | 8/1986 | Price et al. | |
| 4,873,205 A | 9/1989 | Markunas et al. | |
| 4,994,402 A | 2/1991 | Chiu | |
| 5,032,233 A | 7/1991 | Yu et al. | |
| 5,043,300 A | 8/1991 | Nulman | |
| 5,084,406 A | 1/1992 | Rhodes et al. | |
| 5,094,977 A | 3/1992 | Yu et al. | |
| 5,147,819 A | 9/1992 | Yu et al. | |
| 5,187,122 A | 2/1993 | Bonis | |
| 5,196,360 A | 3/1993 | Doan et al. | |
| 5,231,056 A | 7/1993 | Sandhu | |
| 5,236,865 A | 8/1993 | Sandhu et al. | |
| 5,278,098 A | 1/1994 | Wei et al. | |
| 5,319,220 A | 6/1994 | Suzuki et al. | |
| 5,326,992 A | 7/1994 | Yoder | |
| 5,341,016 A | 8/1994 | Prall et al. | |
| 5,378,641 A | 1/1995 | Cheffings | |

(Continued)

FOREIGN PATENT DOCUMENTS

| | | |
|---|---|---|
| DE | 19820147 A1 | 7/1999 |
| JP | 1999-514154 | 1/1998 |

(Continued)

OTHER PUBLICATIONS

Jeong S. Byun, Kwan G. Rha et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.

(Continued)

*Primary Examiner* — Matthew Landau
*Assistant Examiner* — Colleen E Snow
(74) *Attorney, Agent, or Firm* — Knobbe, Martens, Olson & Bear LLP

(57) ABSTRACT

Highly thermally stable metal silicides and methods utilizing the metal silicides in semiconductor processing are provided. The metal silicides are preferably nickel silicides formed by the reaction of nickel with substitutionally carbon-doped single crystalline silicon which has about 2 atomic % or more substitutional carbon. Unexpectedly, the metal silicides are stable to temperatures of about 900° C. and higher and their sheet resistances are substantially unaffected by exposure to high temperatures. The metal silicides are compatible with subsequent high temperature processing steps, including reflow anneals of BPSG.

37 Claims, 9 Drawing Sheets

U.S. PATENT DOCUMENTS

| | | | |
|---|---|---|---|
| 5,378,901 | A | 1/1995 | Nii |
| 5,389,575 | A | 2/1995 | Chin et al. |
| 5,480,814 | A | 1/1996 | Wuu et al. |
| 5,508,212 | A | 4/1996 | Wang et al. |
| 5,656,519 | A | 8/1997 | Mogami |
| 5,656,546 | A | 8/1997 | Chen et al. |
| 5,670,404 | A | 9/1997 | Dai |
| 5,683,922 | A | 11/1997 | Jeng et al. |
| 5,756,394 | A | 5/1998 | Manning |
| 5,831,335 | A | 11/1998 | Miyamoto |
| 5,856,237 | A | 1/1999 | Ku |
| 5,888,903 | A | 3/1999 | O'Brien et al. |
| 5,945,350 | A | 8/1999 | Violette et al. |
| 6,049,098 | A | 4/2000 | Sato |
| 6,074,478 | A | 6/2000 | Oguro |
| 6,117,761 | A | 9/2000 | Manning |
| 6,147,405 | A | 11/2000 | Hu |
| 6,153,010 | A | 11/2000 | Kiyoku et al. |
| 6,183,565 | B1 | 2/2001 | Granneman et al. |
| 6,190,453 | B1 | 2/2001 | Boydston et al. |
| 6,190,976 | B1 | 2/2001 | Shishiguchi et al. |
| 6,277,735 | B1 | 8/2001 | Matsubara |
| 6,316,795 | B1 | 11/2001 | Croke, III |
| 6,345,150 | B1 | 2/2002 | Yoo |
| 6,365,453 | B1 | 4/2002 | Deboer et al. |
| 6,372,584 | B1 | 4/2002 | Yu |
| 6,455,935 | B1 | 9/2002 | Hu |
| 6,462,411 | B1 | 10/2002 | Watanabe et al. |
| 6,486,018 | B2 | 11/2002 | Roberts et al. |
| 6,524,953 | B1 | 2/2003 | Hu |
| 6,566,279 | B2 | 5/2003 | Suemitsu et al. |
| 6,716,713 | B2 | 4/2004 | Todd |
| 6,743,721 | B2 | 6/2004 | Lur et al. |
| 6,821,825 | B2 | 11/2004 | Todd et al. |
| 6,958,253 | B2 | 10/2005 | Todd |
| 6,998,305 | B2 | 2/2006 | Arena et al. |
| 7,153,772 | B2 | 12/2006 | Granneman et al. |
| 2003/0068869 | A1* | 4/2003 | Todd ............................ 438/398 |
| 2004/0262694 | A1 | 12/2004 | Chidambaram |
| 2005/0017310 | A1 | 1/2005 | Granneman et al. |
| 2005/0156258 | A1* | 7/2005 | Park et al. ....................... 257/412 |
| 2006/0134872 | A1* | 6/2006 | Hattendorf et al. ........... 438/300 |
| 2006/0205194 | A1 | 9/2006 | Bauer |
| 2006/0234504 | A1 | 10/2006 | Bauer et al. |
| 2006/0240630 | A1* | 10/2006 | Bauer et al. .................... 438/301 |
| 2007/0287272 | A1 | 12/2007 | Bauer et al. |
| 2008/0138939 | A1* | 6/2008 | Kim ............................... 438/150 |
| 2009/0305500 | A1* | 12/2009 | Lu et al. ......................... 438/655 |
| 2010/0327288 | A1* | 12/2010 | Chao et al. ....................... 257/64 |

FOREIGN PATENT DOCUMENTS

| | | |
|---|---|---|
| JP | 1997-251967 | 12/1999 |
| JP | 2000-208437 | 11/2000 |
| WO | WO 01/50502 | 7/2001 |

OTHER PUBLICATIONS

Jeong Soo Byun, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.

Jeong Soo Byun, Chang Reol Kim et al., "TiN/TiSi2 Formation Using TiNx Layer and Its Feasibilities in ULSI", Jpn. J. Appl. Phys. vol. 35 (1995), pp. 982-986.

Jeong Soo Byun, Hak Nam Kim et al., "Formation of a large grain sized TiN layer using TiNx, the epitaxial continuity at the Al/TiN interface . . . ", J. Appl. Phys. 78(3), Aug. 1, 1995, pp. 1719-1724.

Jeong Soo Byun, Jun Ki Kim et al., "W as a Bit Line Interconnection in Capacitor-Over-Bit-Line (COB) Structured Dynamic Random Access Memory (DRAM) and Feasible Diffusion Barrier Layer", Jpn. J. Appl. Phys. vol. 35 (1996), pp. 1086-1089.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Lou, et al., "The Process Window of a-Si/Ti Bilayer Metallization for an Oxidation-Resistant and Self-Aligned TiSi2 Process," IEEE Transactions on Electron Devices, vol. 39, No. 8, Aug. 1992, pp. 1835-1843.

Pages, et al., "The effect of ramp rate—short process time and partial reactions on cobalt and nickel silicide formation," Proceedings 205th ECS Meeting, May 9-13, 2004, San Antonio TX, USA, p. 174-182.

Van Houtum, H. et al., "TiSi2 strap formation by Ti-amorphous-Si reaction," J. Vac. Sci. Technol. B 6(6), Nov./Dec. 1988, pp. 1734-1739.

Antonell et al., "Carbon incorporation for strain compensation during solid phase epitaxial recrystallization of SiGe on Si at 500-600° C," J. Appl. Phys. 79 (10), pp. 7646-7651, (May 15, 1996).

Aoyama et al., "Si selective epitaxial growth using $Cl_2$ pulsed molecular flow method," Thin Solid Films 321, pp. 256-260 (1998).

Bauer et al., "$Si_3H_8$ Based Epitaxy of Biaxially Stressed Silicon Films Doped with Carbon and Arsenic for CMOS Applications," Mater. Res. Soc. Symp. Proc., vol. 864, Materials Research Society (2005).

Bauer et al., "Time resolved reflectivity measurements of silicon solid phase epitaxial growth," Thin Solid Films, 000, pp. 228-232 (2000).

Berti et al. "Lattice parameter in $Si_{1-y}C_y$ epilayers: Deviation from Vegard's rule," Appl. Phys. Lett., vol. 72, No. 13, 1602-1604 (Mar. 30, 1998).

Celotti et al. "Lattice parameter study of silicon uniformly doped with boron and phosphorous," Journal of Materials Science 9, 821-828 (1974).

Eberl et al., "Structural properties of SiC and SiGeC alloy layers on Si," 75-77 (Mar. 1999).

Feng et al., "Raman determination of layer stresses and strains for heterostructures and its application to the cubic SiC/Si system," J. Appl. Phys. 64 (12), 6827-6835 (Dec. 15, 1988).

Goesele et al., "Diffusion Engineering by Carbon in Silicon," Mat. Res. Soc. Symp. vol. 610, B71.1-B712.1 (2000).

Hartmann et al., "High C content Si/$Si_{1-y}C_y$ heterostructures for n-type metal oxide semiconductor transistors," Semicond. Sci. Technol. 19, 593-601 (2004).

Hoyt, Judy L., "Substitutional Carbon Incorporation and Electronic Characterization of $Si_{1-y}C_y$/Si and $Si_{1-x-y}Ge_xC_y$/Si Heterojunctions," Solid State Electronics and Photonics Laboratory, Center for Integrated Systems, Rm. 325X, Stanford, CA, Chapter 3, 59-89; (Mar. 23, 2002).

Kim et al., "Low temperature selective Si epitaxy by reduced pressure chemical vapor deposition introducing periodic deposition and etching cycles with $SiH_4$, $H_2$ and HCl," Mat. Res. Soc. Symp. Proc., vol. 609 (2000).

Kouvetakis, John and Mayer, James W., "Synthesis and Analysis of Compounds and Alloys in the GeC, SiC, and SiGeC Systems," Department of Chemistry and Biochemistry and Center for Solid State Science, Arizona State University, Tempe, AZ; (Mar. 21, 2002).

Meléndez-Lira et al., "Substitutional carbon in $Si_{1-y}C_y$ alloys as measured with infrared absorption and Raman spectroscopy," J. Appl. Phys. 82 (9), 4246-4252 (Nov. 1, 1997).

Mertens et al. "Study of Ni-silicide contacts to Si:C source/drain" , The Electrochemical Society Meeting, (Oct. 30, 2006), Cancun, Mexico.

Oehme et al., "Carbon Segregation in Silicon," Thin Solid Films 380, 75-77 (2000).

O'Neil et al., "Optimization of Process Conditions for Selective Silicon Epitaxy Using Disilane, Hydrogen, and Chlorine," J. Electrochem. Soc., vol. 144, No. 9, 3309-3315 (Sep. 1997).

Osten et al., "Substitutional carbon incorporation in epitaxial $Si_{1-y}C_y$ alloys on Si(001) growth by molecular beam epitaxy," Applied Physics Letters, vol. 74, No. 6, 836-838 (Feb. 8, 1999).

Osten et al., "Substitutional versus interstitial carbon incorporation during pseudomorphic growth of $Si_{1-y}C_y$ on Si(001)," *J. Appl. Phys.* 80 (12), 6711-6715 (Dec. 15, 1996).

Strane et al., "Carbon incorporation into Si at high concentrations by ion implantation and solid phase epitaxy," *J. Appl. Phys.* 79 (2), 637-646; (Jan. 15, 1996).

Strane et al., "Precipitation and relaxation in strained $Si_{1-y}C_y$/Si heterostructures," *J. Appl. Phys.* 76 (6) 3656-3668 (Sep. 15, 1994).

Windl et al., "Theory of strain and electronic structure of $Si_{1-y}C_y$ and $Si_{1-x-y}Ge_xC_y$ alloys," *Physical Review B*, vol. 57, No. 4, 2431-2442 (Jan. 15, 1998).

Wolf et al., "Silicon Processing for the VLSI era," vol. 1, $2^{nd}$ edition; Lattice Pr (Sep. 2000).

* cited by examiner

STABLE SILICIDE FILMS AND METHODS FOR MAKING THE SAME

CROSS-REFERENCE TO RELATED APPLICATIONS

This application claims the priority benefit of U.S. provisional Application No. 60/918,342, filed Mar. 16, 2007, entitled STABLE SILICIDE FILMS AND METHODS FOR MAKING THE SAME.

In addition, this application is related to: U.S. patent application Ser. No. 11/343,275, filed Jan. 30, 2006; U.S. patent application Ser. No. 10/866,643, filed Jun. 10, 2004, now U.S. Pat. No. 7,153,772, issued Dec. 26, 2006; U.S. patent application Ser. No. 11/536,463, filed Sep. 28, 2006, the disclosure of each of which is hereby incorporated by reference in its entirety.

BACKGROUND OF THE INVENTION

1. Field of the Invention

This invention relates generally to semiconductor processing and, more particularly, to metal silicides and methods for making metal silicides.

2. Description of the Related Art

Metal silicides are a commonly used material in semiconductor processing. As is well known, semiconductor processing is typically employed in the fabrication of integrated circuits, but such processing is also employed in a variety of other fields. For example, semiconductor processing techniques are often employed in the fabrication of flat panel displays using a wide variety of technologies and in the fabrication of microelectromechanical systems ("MEMS"). Metal silicides are commonly used, e.g., in integrated circuits, to form electrical contacts with low contact resistance (forming ohmic contacts). As a result, metal silicides having a low electrical resistance are desirable.

After a silicide is formed, the silicide is typically subjected to additional processing steps. For example, when a silicide is used to form source/drain contacts for a transistor, a dielectric, such as borophosphosilicate glass ("BPSG"), is deposited over the silicide to insulate the transistor and the source/drain contacts from other conductive elements. The BPSG is then annealed at a high temperature to cause it to reflow, to planarize the BPSG layer, thereby facilitating later processing steps.

It will be appreciated that as the sizes of electrical features decrease, changing process requirements have necessitated the development of new silicides. Nickel silicides (NiSi) have emerged as a possible candidate for use in fabricating electrical devices with very small feature sizes.

NiSi, however, has been discounted for use for many applications because of its instability at high temperatures, particularly those temperatures used in conjunction with the planarization of dielectrics, such as BPSG. While such planarization anneals are typically performed at temperatures of 700-950° C., NiSi is thermally unstable at such high temperatures. At higher temperatures, NiSi can lose its structural integrity. For example, nucleation or agglomeration can occur at these temperatures, causing voids and discontinuities. The resulting discontinuous silicide has an undesirably high electrical sheet resistance. In addition, spiking of the silicide can occur at high temperatures, causing the silicide to extend into a substrate and possibly causing an electrical short with other conductive features.

Variants of nickel silicides have also been developed and investigated. Such variants include carbon-doped nickel silicides. Ni-silicided carbon-doped Si films containing up to 1.3 atomic % carbon have been reported. Undesirably, however, carbon doping increases the resistance of the silicide, with increasing carbon-doping leading to increasing resistance, which runs counter to the desire for low resistance for many applications, including the formation of contacts. Moreover, the sheet resistance of the carbon-doped nickel silicide increases significantly as a function of temperature at temperatures greater than about 800° C. See, e.g., S. Mertens, The Electrochemical Society Meeting, Oct. 30, 2006, Cancun, Mexico. It will be appreciated that this increase in resistance coincides with the temperatures for typical BPSG anneals, which are typically performed at greater than about 700° C.

Accordingly, there is a need for silicides having good high temperature stability and good electrical resistance behavior after processing at high temperatures.

SUMMARY

According to one aspect of the invention, a method is provided for semiconductor processing. The method comprises forming a silicon film comprising at least about 2 atomic % carbon on a substrate in a reaction chamber. A metal film is deposited on the silicon film. The metal film and the silicon film are annealed to form a metal silicide. A dielectric film such as, e.g., a BPSG layer, is formed above the metal silicide. The dielectric layer is planarized by subjecting it to an anneal.

According to another aspect of the invention, a method for semiconductor processing is provided. The method comprises providing a substrate having a silicon film doped with carbon. The silicon film is reacted with nickel to form a nickel silicide. The nickel silicide is subsequently annealed at about 700° C. or more. A sheet resistance of the nickel silicide is less than about 12 Ohm/sq after annealing the nickel silicide.

According to yet another aspect of the invention, an integrated circuit is provided. The integrated circuit comprises a metal silicide comprising 1 atomic % or more carbon. A patterned BPSG layer overlies the metal silicide.

DETAILED DESCRIPTION OF SOME EMBODIMENTS

Figure 1A:
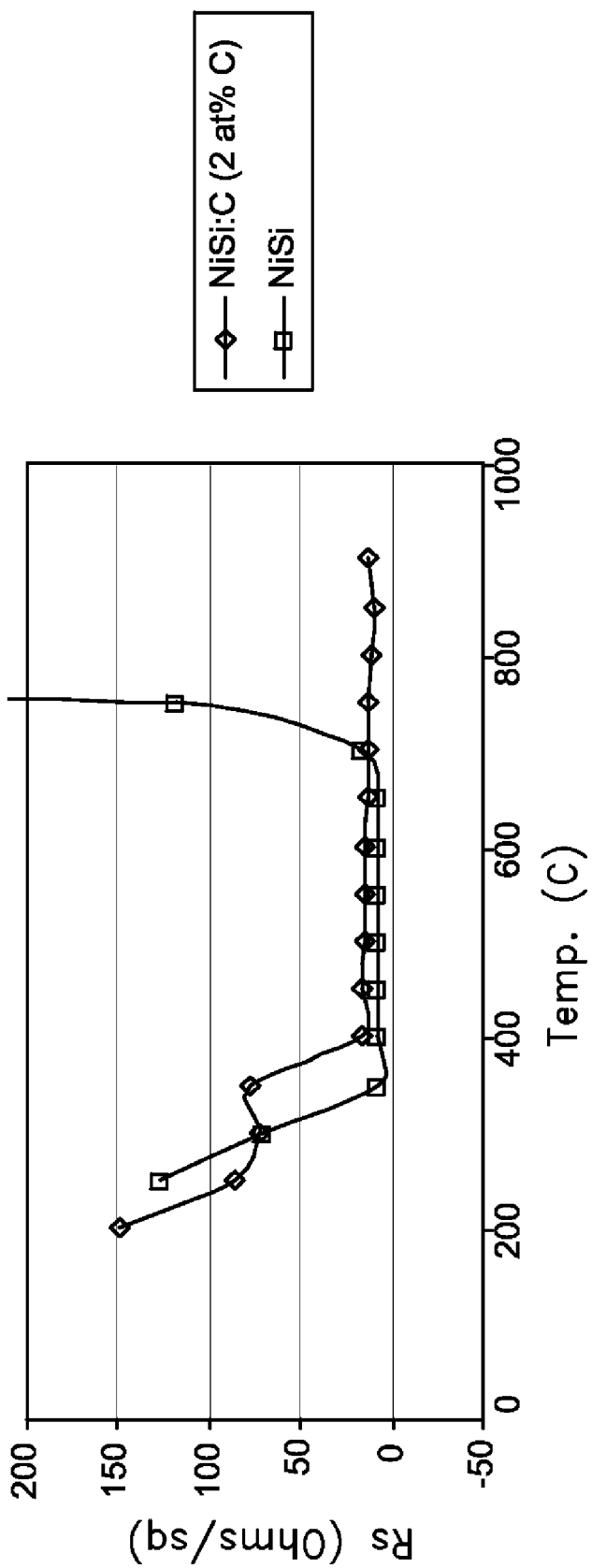
FIG. 1A shows a plot of sheet resistance as a function of temperature for nickel silicide and for carbon-doped nickel silicide formed from silicon and carbon-doped silicon containing 2% carbon, respectively, in accordance with some embodiments of the invention.

Metal silicides which are unexpectedly thermally stable at exceptionally high temperatures have been developed. The silicides are formed from carbon-doped silicon that has been reacted with a metal, preferably nickel. The silicon has exceptionally high levels of carbon, which unexpectedly has allowed the formation of metal silicides which are stable at very high temperatures. The carbon-doped nickel silicide can be represented as NiSi:C, with Ni, Si and C indicating that the films include nickel, silicon and carbon, although no relative ratio or quantity of materials is intended or implied.

The silicides preferably are formed from silicon which includes about 2 atomic % or more carbon and, more preferably, about 2.5 atomic % or more carbon. In some embodiments, the silicon from which the silicides are formed include about 2.7 atomic % or more carbon. The carbon-doped silicon from which the silicides are formed is preferably substitutionally carbon-doped single crystalline silicon. In some embodiments, the carbon-doped single crystalline silicon includes about 2 atomic % or more substitutional carbon and, more preferably, about 2.5 atomic % or more substitutional carbon. In some other embodiments, the carbon-doped single crystalline silicon can include about 2.7 atomic % or more substitutional carbon.

It will be appreciated that the carbon is diluted after reaction of the carbon-doped silicon with metal. After the silicidation reaction, the metal silicide preferably includes about 1 atomic % or more carbon and, more preferably, about 1.25 atomic % or more carbon. In some embodiments, the silicide can include about 1.35 atomic % or more carbon.

Advantageously, the silicides have been found to be thermally stable at temperatures of about 800° C. or higher, more preferably, about 850° C. or higher and, most preferably, about 900° C. or higher. The sheet resistance of the silicides as a function of temperature has been found to be substantially flat for anneal temperatures from about 400-900° C. For anneals at any temperature between about 800-900° C., the sheet resistance advantageously rises by about 6 Ohm/sq or less and, more preferably, about 3 Ohm/sq or less, relative to the sheet resistance at 800° C.

Moreover, the sheet resistance of the silicides has been found to be advantageously low, even after subjecting the silicides to post-silicidation, high temperature anneals, such as a BPSG reflow anneal. The sheet resistance is preferably less than about 16 Ohm/sq after the anneal, more preferably, about 14 Ohm/sq or less and, most preferably, about 12 Ohm/sq or less after an anneal, such as a post-silicidation anneal to greater than about 800° C.

The silicides can be used in various applications, including in the formation of electrical contacts with very small feature sizes. Preferably, the critical dimension of the silicide is less than about 45 nm and, more preferably, less than about 32 nm. Moreover, because of their thermal stability, the silicides are compatible with process flows involving various subsequent high temperature processing steps. For example, the silicides are compatible with high temperature planarization anneals, such as BPSG anneals, of about 700-850° C. and more preferably, about 700-900° C. In some embodiments, the anneals are performed at temperatures of about 800-900° C.

Carbon-Doped Nickel Silicides and Methods

As noted above, in accordance with some embodiments, a carbon-doped nickel silicide is preferably formed by reacting carbon-doped silicon with nickel. In some embodiments, the carbon-doped single crystalline silicon can be substitutionally doped with carbon, which can have a highly uniform distribution of carbon in the silicon. However, in other embodiments, carbon-doped nickel silicides according to the some embodiments have been found to have sheet resistances which are minimally or not at all impacted by how carbon is incorporated into the silicon material. Thus, silicides according to some embodiments have unexpectedly low sheet resistances even where the silicon is not substitutionally doped and/or not uniformly doped with carbon.

Carbon-doped single crystalline silicon can be formed by a method comprising: providing a substrate disposed within a chemical vapor deposition ("CVD") reactor; introducing trisilane and a carbon source to the reactor under chemical vapor deposition conditions; and depositing a single crystalline silicon film onto the substrate. The deposition is preferably carried out at a deposition rate of at least about 5 nm per minute, more preferably at least about 10 nm per minute, even more preferably at least about 20 nm per minute. Preferably, the resulting single crystalline silicon film comprises at least about 2.0 atomic % carbon, more preferably about 2.5 atomic % or greater carbon, even more preferably 2.7 atomic % or greater carbon. In some embodiments, the silicon is substitutionally-doped with carbon. A suitable method for forming carbon-doped silicon films is disclosed in U.S. Patent Application Publication No. 2006/0240630, assigned to the assignee of the present application, the entire disclosure of which is incorporated by reference herein. That method allows for the formation of substitutionally carbon-doped single crystalline silicon.

Figure 3:
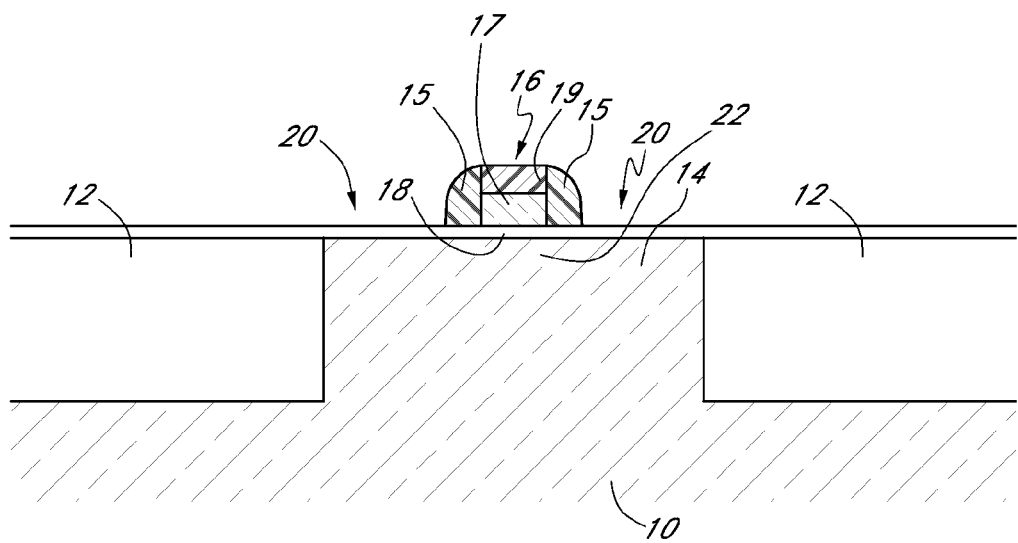
FIG. 3 shows the structure of FIG. 2 after formation of a transistor gate electrode within an active area window, in accordance with some embodiments of the invention.

It will be appreciated that the amount of carbon doped into a silicon film can be determined by various methods known in the art. For example, the amount of carbon substitutionally doped into a silicon film may be determined by measuring the perpendicular lattice spacing of the doped silicon material by x-ray diffraction, then applying Vegard's law in a manner known to those skilled in the art. For example, the amount of carbon substitutionally doped into Si may be determined by measuring the perpendicular lattice spacing of the doped Si by x-ray diffraction, then applying Vegard's law. Those skilled in the art are aware of Vegard's law and the relationships between substitutional carbon level, lattice spacing and strain. See, e.g., Judy L. Hoyt, "Substitutional Carbon Incorporation and Electronic Characterization of $Si_{1-y}C_y$/Si and $Si_{1-x-y}Ge_xC_y$/Si Heterojunctions," Chapter 3 in "Silicon-Germanium Carbon Alloy," Taylor and Francis, N.Y., pp. 59-89, 2002. As illustrated in FIG. 3.10 at page 73 of the aforementioned article by Hoyt, the total carbon content in the doped silicon may be determined by SIMS, and the non-substitutional carbon content may be determined by subtracting the substitutional carbon content from the total carbon content. The amount of any other elements doped into other Si-containing materials may be determined in a similar manner.

The disclosed deposition methods may be suitably practiced by employing CVD, including plasma-enhanced chemical vapor deposition (PECVD) or thermal CVD, utilizing trisilane vapor and a carbon source to deposit a single crystalline silicon film, a carbon-doped epitaxial Si film, onto a substrate within a CVD chamber. In some embodiments, a gaseous chlorine-containing etchant, such as HCl or, more preferably, diatomic chlorine, is introduced to the chamber in conjunction with the trisilane and carbon source to thereby selectively deposit a single crystalline silicon film.

Trisilane and the carbon source, and an etchant gas, in certain embodiments, are preferably introduced into the CVD chamber in the form of separate gases or by intermixing to form a feed gas. The intermixing to form the feed gas may take place in the chamber or prior to introduction of the feed gas to the chamber. The total pressure in the CVD chamber is preferably in the range of about 0.001 Torr to about 1000 Torr, more preferably in the range of about 0.1 Torr to about 350 Torr, most preferably in the range of about 0.25 Torr to about 100 Torr.

Examples of suitable carbon sources that may be included in the feed gas include without limitation silylalkanes such as monosilylmethane, disilylmethane, trisilylmethane and tetrasilylmethane, and/or alkylsilanes such as monomethyl silane (MMS), and dimethyl silane. In some embodiments, a carbon source comprises $H_3Si—CH_2—SiH_2—CH_3$ (1,3-disilabutane).

A suitable manifold may be used to supply feed gas(es) to the CVD chamber. The CVD chamber is preferably in a single substrate reactor, e.g., a single substrate, horizontal gas flow CVD chamber. Preferably, the CVD chamber is in a single-substrate, single pass, laminar horizontal gas flow reactor, radiantly heated. Suitable reactors of this type are commercially available, and preferred models include the Epsilon™ series of single substrate reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but as noted above, thermal CVD is preferred.

Thermal CVD is preferably conducted at a substrate temperature that is effective to deposit a crystalline silicon film over the substrate. Preferably, thermal CVD is conducted at a temperature in the range of between about 350° C. to about 900° C., more preferably about 500° C. to about 800° C. In an embodiment, the chemical vapor deposition conditions comprise a temperature that is at about a transition temperature between substantially mass-transport controlled deposition conditions and substantially kinetically controlled deposition conditions for trisilane. Such trisilane deposition conditions are described in U.S. Pat. No. 6,821,825, which is hereby incorporated by reference. PECVD is preferably conducted at a temperature in the range of between about 300° C. to about 700° C.

For trisilane depositions conducted in single substrate reactors such as the Epsilon™ series reactors, trisilane flow rates are in the range of between about 5 mg/min (milligrams per minute) and about 2,000 mg/min, preferably in the range of between about 50 mg/min and about 500 mg/min, more preferably between about 100 mg/min and about 300 mg/min; carbon source (e.g., MMS) flow rates are preferably in the range of between about 80 sccm and about 1000 sccm; ratios of carbon source flow rates to trisilane flow rates are preferably in the range between about 0.5 standard cubic centimeters of carbon source per milligram trisilane (scc/mg) and about 8.0 scc/mg, more preferably from between about 0.9 scc/mg and about 3.0 scc/mg; carrier gas flow rates are preferably in the range between about 1 slm and about 50 slm, more preferably between about 10 slm and about 40 slm; deposition rates are preferably at least about 5 nm per minute, more preferably at least about 10 nm per minute; deposition pressures are preferably in the range between about 1 Torr and about 200 Torr, more preferably between about 10 Torr and about 100 Torr, even more preferably between about 20 Torr and about 100 Torr; and deposition temperatures are preferably in the range between about 450° C. and about 600° C., more preferably in the range between about 500° C. and about 575° C. Those skilled in the art can adapt these conditions to various types of equipment and deposition configurations, using the guidance provided herein and routine experimentation.

Deposition of silicon films using trisilane as described herein can offer significant advantages over the use of conventional silicon sources when conducted as described herein. For example, at a given deposition temperature, deposition of silicon films using trisilane preferably proceeds at a rate that is significantly faster than when silane is used instead of trisilane. A preferred embodiment provides a high rate deposition method in which trisilane is delivered to the substrate surface at a delivery rate of about 50-200 mg/min. Under thermal CVD conditions, preferably at a deposition temperature in the range of about 500° C. to about 800° C., practice of this embodiment results in relatively fast deposition of the silicon material (as compared to other silicon sources), often at a rate of about 50 Å per minute or higher, preferably about 100 Å per minute or higher, more preferably about 200 Å per minute or higher. Depositions using trisilane can be carried out at even higher deposition rates, e.g., about 400 Å per minute or higher, preferably about 800 Å per minute or higher, even more preferably about 1,000 Å per minute or higher.

In addition, the compositional uniformity of preferred carbon-doped crystalline silicon films made in accordance with the methods described herein is materially improved as compared to corresponding films made without the use of trisilane. This invention is not bound by any theory of operation, but it is believed that the silicon films have a degree of compositional uniformity that is better than corresponding silicon films deposited using conventional precursors such as silane, dichlorosilane (DCS) or trichlorosilane (TCS). Furthermore, using trisilane and it's attendant high deposition rates, the films can be prepared containing relatively high levels of non-silicon element(s). For example, crystalline Si:C preferably contains between about 2 atomic % and about 3.5 atomic % of carbon.

While thinner layers are contemplated, the carbon-doped silicon film is preferably formed to a thickness greater than or about equal to the thickness of a later deposited nickel film. Preferably, the thickness of the carbon-doped silicon film is about 10 nm or greater, more preferably, about 20 nm or greater and, most preferably, between about 20-200 nm.

Nickel is subsequently deposited directly over the carbon-doped silicon film. The nickel is preferably blanket deposited over the substrate, including exposed carbon-doped silicon, by various methods known to those of skill in the art. For example, the nickel can be deposited by physical vapor deposition (PVD).

The carbon-doped silicon film is reacted with the nickel at the points of contact between these layers to form the carbon-doped nickel silicide (NiSi:C). This reaction is preferably caused by annealing the film and the nickel. Preferably, the anneal is performed at less than about 600° C. and, more preferably, between about 300-600° C. Advantageously, the resulting NiSi:C has about 1 atomic % or more carbon, more preferably, about 1.25 atomic % or more carbon and, more preferably, about 1.35 atomic % or more carbon.

Reference will now be made to the FIGURES, where like numerals refer to like features throughout.

Figure 1B:
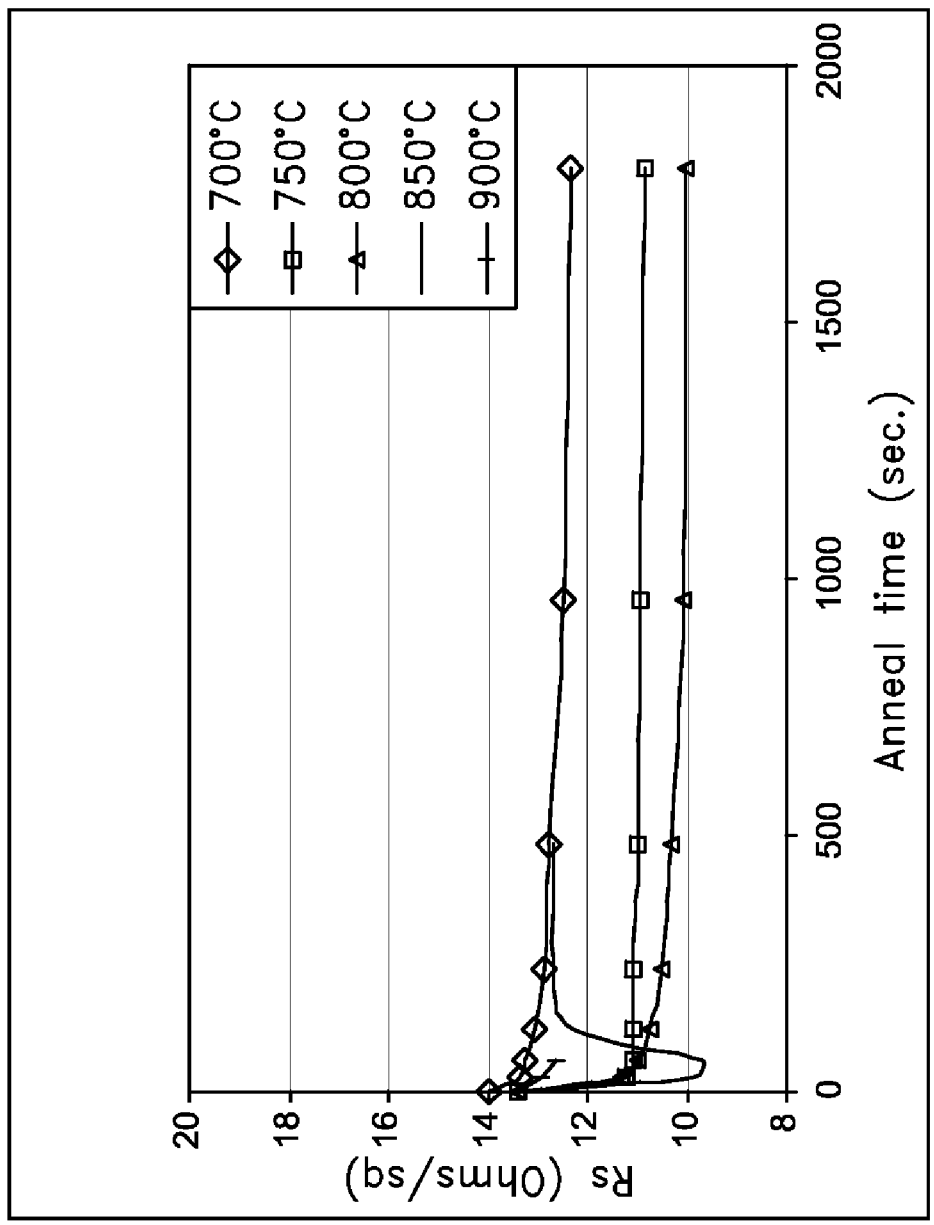
FIG. 1B shows a plot of sheet resistance as a function of time for anneals performed at various temperatures carbon, in accordance with some embodiments of the invention.

With reference to FIGS. 1A and 1B, sheets resistances are shown for NiSi:C formed in an Epsilon™ series reactor under the preferred conditions discussed above. The resulting NiSi:C is advantageously stable at high temperatures. FIGS. 1A and 1B show the sheet resistance of NiSi:C, formed by metal reaction with Si:C containing 2 atomic % carbon, after exposure to various temperatures. The sheet resistance is indicative of the thermal stability of a metal silicide, with large increases in resistance indicating instability at a particular temperature. It will be appreciated that the large increases in resistance are caused by phase changes in the material brought about by temperature instability.

As shown in FIG. 1A, the sheet resistance of the nickel silicide without carbon doping climbs drastically after exposure to temperatures of 700° C. In contrast, the sheet resistance of the NiSi:C sample was substantially flat from about 400° C. up to about 900° C. Thus, the NiSi:C was found to be thermally stable up to at least about 900° C., while NiSi was stable only up to about 700° C.

Moreover, with reference to FIG. 1B, post silicidation annealing at temperatures from 700-900° C. did not increase the resistivity of the NiSi:C. Rather, for the anneal durations which were evaluated, the sheet resistance was below 14 Ohm/sq and remained below that level for all anneal durations of about 1750 seconds or less. These results further show that the NiSi:C is thermally stable up to temperatures of at least about 900° C. and even higher than 900° C.

This thermal stability allows the NiSi:C to be utilized in various process flows in which high temperature processing steps are performed after the formation of the NiSi:C. An example of a suitable process flow is discussed below and illustrated in the FIGS. 2-15.

Exemplary Process Flow

Figure 2:
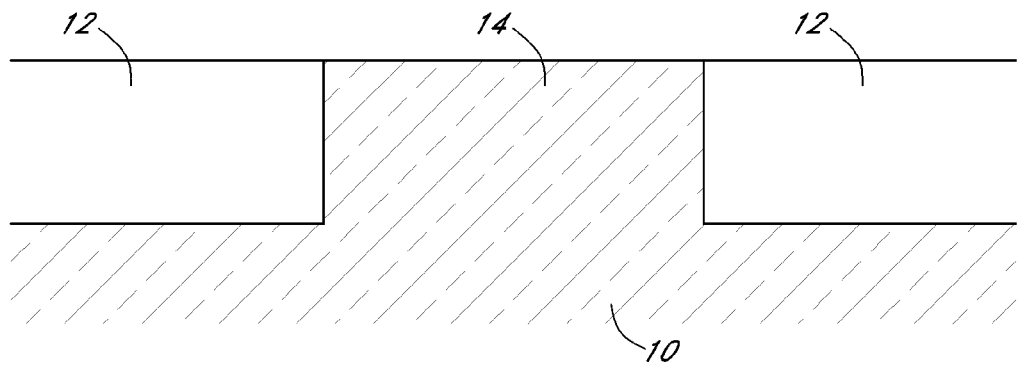
FIG. 2 is a schematic cross section of a semiconductor substrate after field oxide definition, leaving insulator and semiconductor surfaces exposed, in accordance with some embodiments of the invention.

FIG. 2 is a schematic cross-sectional view showing a substrate 10, comprising a silicon substrate in the illustrated embodiment. The substrate 10 can include an epitaxial layer 11 formed over a silicon wafer or a silicon-on-insulator (SOI) substrate. Field isolation regions 12 have been formed by conventional shallow trench isolation (STI) techniques, defining active areas in windows among the STI elements. A single active area 14 is illustrated. Alternatively, any suitable method can be used to define field insulating material, including local oxidation of silicon (LOCOS) and a number of variations on LOCOS or STI. It will be understood that several active areas are typically defined simultaneously by STI across the substrate 10, and that the field insulation often forms a web separating transistor active areas 14 from one another. The substrate is preferably background doped at a level suitable for channel formation.

FIG. 3 illustrates the substrate 10 after formation of a gate electrode 16 over the active area 14. The gate electrode 16 includes a pair of spacers 15 formed around a silicon electrode 17, which is covered by a cap layer 19. While illustrated as a traditional silicon electrode, surrounded by insulating spacers and cap layers, and separated from the underlying substrate 10 by a gate dielectric layer 18, it will be understood that the transistor gate stack can have any of a variety of configurations. In some process flows, for example, the spacers 15 can be omitted. In the illustrated embodiment, the definition of the gate electrode 16 defines source and drain regions 20 on either side of the transistor gate electrode 16 within the active area 14. The gate electrode 16 also defines a channel region 22 under the gate electrode 16 and between the source and drain regions 20.

Figure 4:
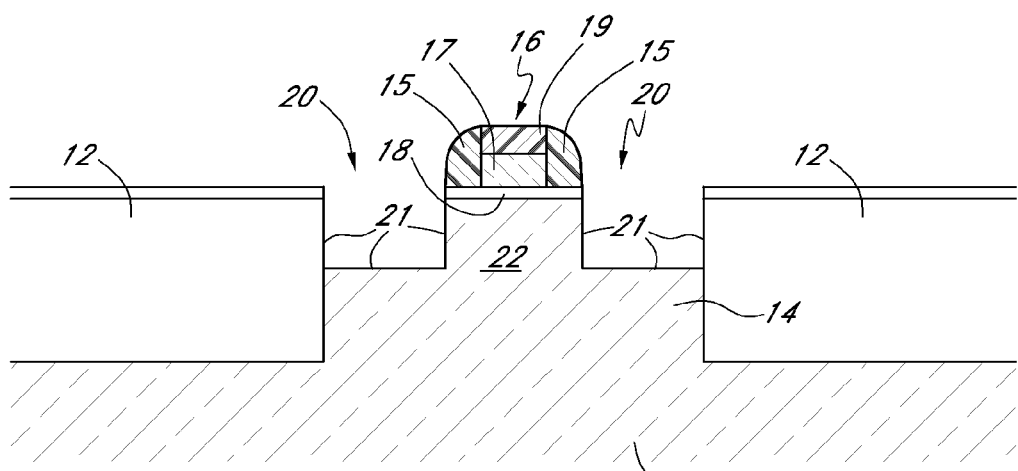
FIG. 4 shows the structure of FIG. 3 after recessing source and drain regions on either side of the gate electrode, in accordance with some embodiments of the invention.

FIG. 4 illustrates the result of an optional etch step that selectively removes exposed silicon, in accordance with some embodiments. Preferably, a reactive ion etch (RIE) is employed to ensure vertical sidewall definition of openings in the source and drain regions 20 and minimal damage to exposed oxide and nitride materials. As the exposed silicon is essentially the source and drain (S/D) regions 20 of the active area 14, the etch is referred to as a source/drain recess. It will be understood that, in some arrangements, a first step of clearing the thin dielectric from over the source/drain regions may be employed.

Figure 5:
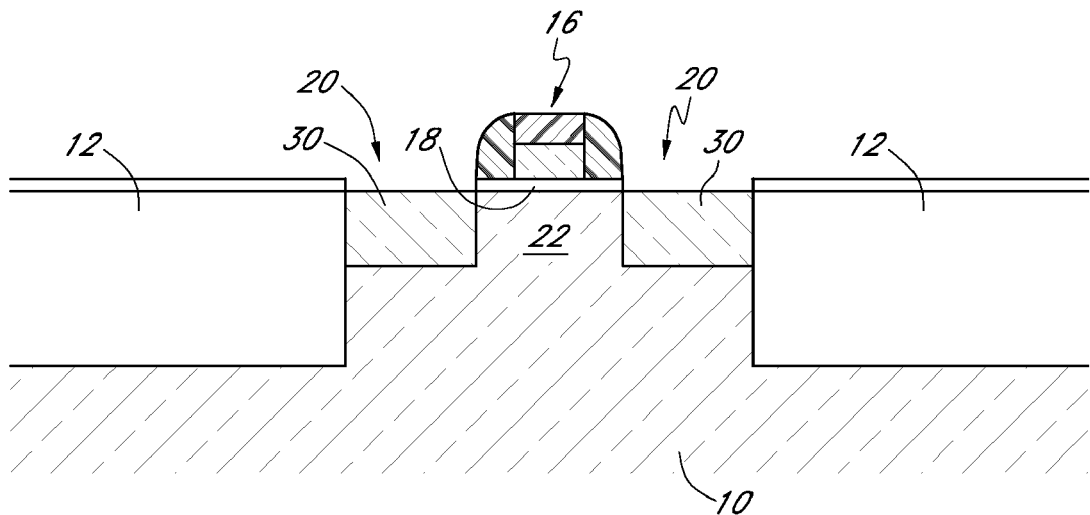
FIG. 5 shows the structure of FIG. 4 after selective deposition of a semiconductor film within the recessed regions, in accordance with some embodiments of the invention.

FIG. 5 shows the result of refilling the recessed S/D regions 20 with a selective deposition process. Before the refill, the exposed semiconductor surfaces 21 (FIG. 4) are cleaned, such as with an HF vapor or HF last dip, leaving a pristine surface for epitaxy thereover. Carbon-doped single-crystalline silicon 30 is then selectively deposited into the recessed S/D regions 20.

It has been found that excellent deposition selectivity can be obtained by the use of trisilane in combination with an etchant. Exemplary etchants include, but not limited to, chlorine-containing etchants. Examples of chlorine-containing etchants are HCl, hexachlorodisilane ($Si_2Cl_6$) and chlorine gas ($Cl_2$). Experiments have shown that selectivity can be about 100%, such that there is nearly zero deposition on surrounding insulators such as silicon oxide and silicon nitride. HCl may be provided as an etchant in selective silicon-based deposition processes, where the etch effects upon slow-nucleating deposition on amorphous, typically insulating surfaces is greater than the etch effects on exposed semiconductor surfaces. Chlorine gas is preferred as an etchant, since HCl is difficult to purify and typical commercial sources of HCl introduce excessive moisture into the deposition process. Such moisture can lower the conductivity of deposited films, and cause unacceptable levels of defects in epitaxial deposition. Accordingly, the use of a feed gas comprising trisilane, a carbon source and chlorine advantageously achieves high levels of selectivity without added etchants, and particularly without HCl.

With continued reference to FIG. 5, to selectively deposit the carbon-doped silicon film, trisilane and chlorine are introduced, as described above, along with a source of carbon. A silicon and carbon-containing epitaxial layer 30 grows selectively in the S/D regions 20. In the illustrated embodiment, the heteroepitaxial film 30 is approximately flush with the surface of the channel region 22. As illustrated, the selective deposition minimizes or avoids deposition over the amorphous regions, such as over the insulators, including field isolation regions 12 (generally a form of silicon oxide) and the spacers and cap of the gate electrode 16, which can be formed of silicon nitride. The selectively deposited, heteroepitaxial film 30, comprising substitutionally doped Si:C, fills the S/D regions 20 and advantageously can exert tensile strain on the channel region 22, which increases charge carrier mobility in the channel region 22, particularly for NMOS transistors.

Figure 6:
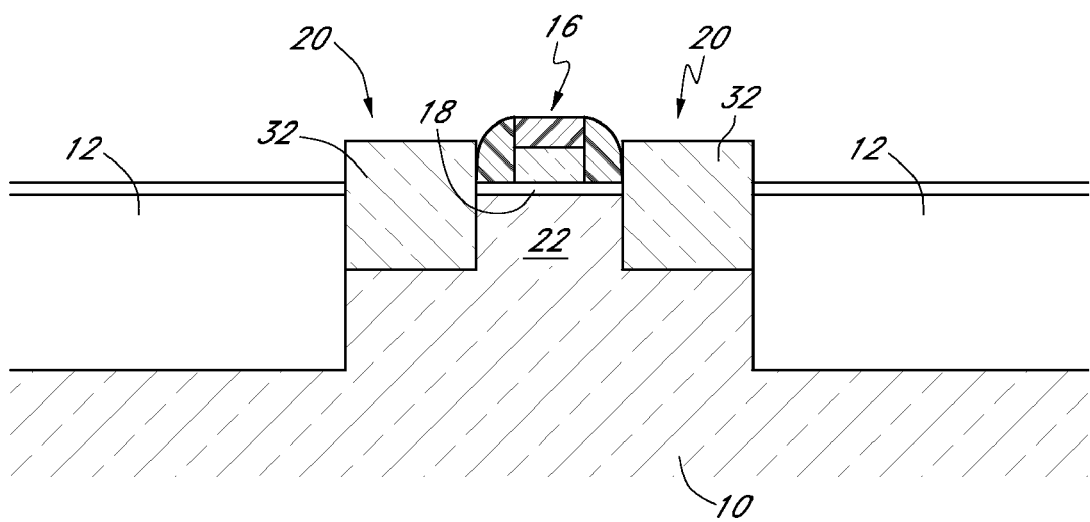
FIG. 6 shows the structure of FIG. 5 after optional continued selective deposition, forming elevated source/drain structures, in accordance with some embodiments of the invention.

FIG. 6 illustrates an optional extension of the selective deposition to form elevated S/D regions 20 with an extended heteroepitaxial film 32. As the portion of the extended film 32 below the surface of the channel region 22 exerts lateral stress on the channel region 22, the portion above the surface of the substrate can be consumed in forming a silicide while maintaining the benefits of strain caused by the unconsumed portions of the heteroepitaxial film 32 below the surface of the substrate 10.

Figure 7:
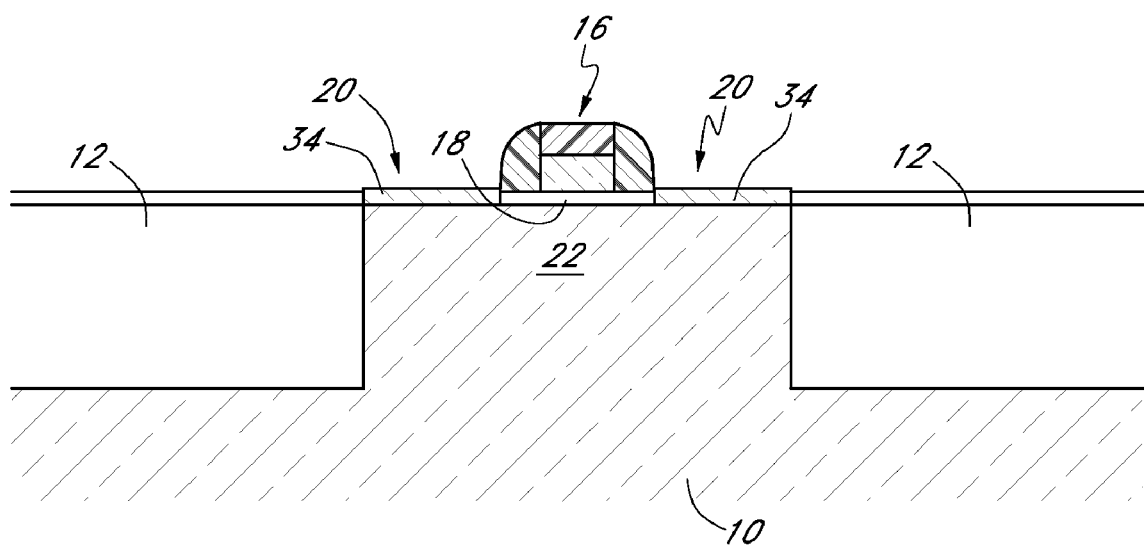
FIG. 7 shows the structure of FIG. 3 after exposing the semiconductor window and conducting a selective deposition to form elevated source/drain structures, in accordance with some embodiments of the invention.

FIG. 7 shows another embodiment, wherein the structure of FIG. 3 is subjected to a selective deposition using trisilane, a carbon source and chlorine, without an intervening S/D recess step. In this embodiment, the selective deposition serves only to raise or elevate the source and drain regions 20, providing excess carbon-doped silicon film 34 to permit consumption by contact silicidation without destroying shallow junctions, which may be formed immediately beneath the film 34.

It will be appreciated that the carbon-doped silicon film 34 can also be formed by blanket deposition of carbon-doped silicon. A mask can then be formed over the blanket layer to protect the portions of the layer that will form the carbon-doped silicon 34. Unprotected portions of the layer can be selectively removed, leaving the carbon-doped silicon film 34.

The selective nature of the deposition in the trisilane/chlorine process obviates subsequent pattern and etch steps to remove excess deposition from over field regions 12. Even imperfect selectivity can permit use of a timed wet etch to remove unwanted deposition over insulating surfaces, rather than requiring an expensive mask step. Furthermore, good film quality is obtained at relatively high deposition rates, relative to a highly selective process, thereby improving throughput and increasing carbon content without sacrificing selectivity.

Figure 8A:
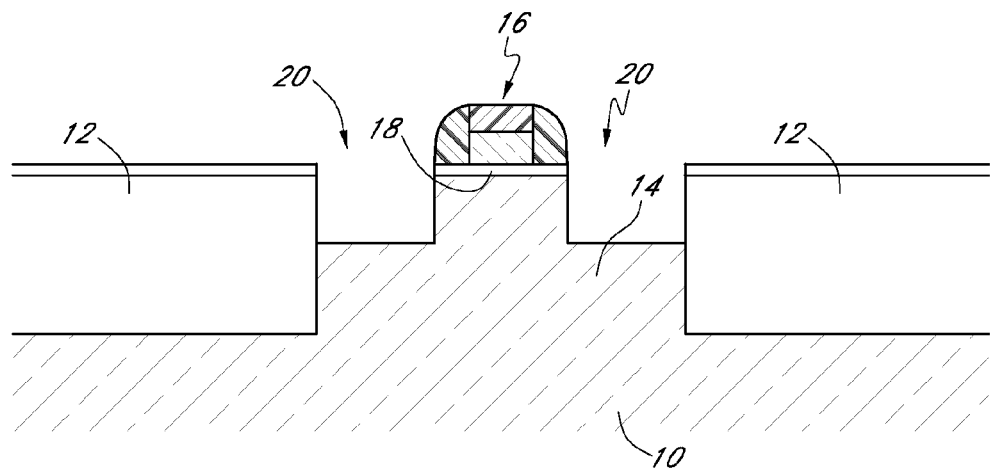
FIGS. 8A-C show a series of schematic cross sections of a semiconductor substrate and illustrate a method of forming source/drain regions by blanket deposition and etching, in accordance with some embodiments of the invention.
Figure 8B:
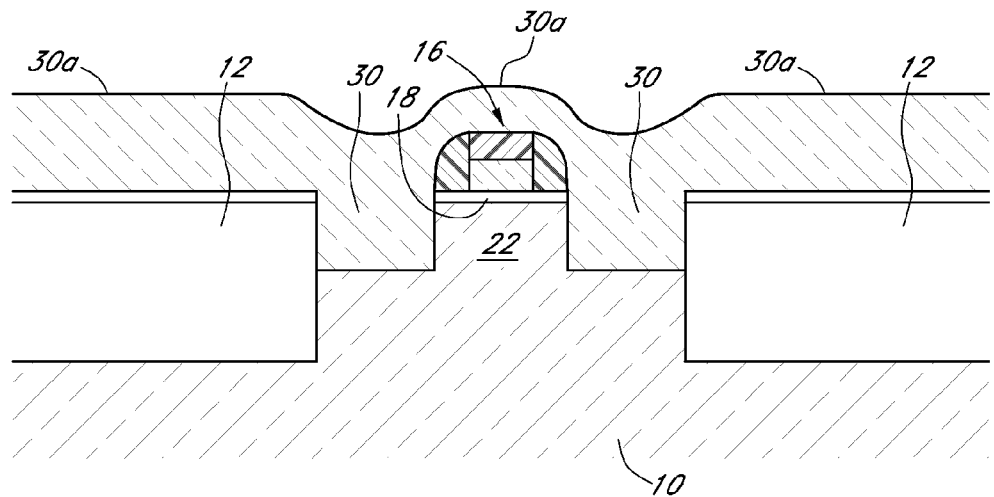

Rather than selectively depositing Si:C, a Si:C layer may be formed by a process that involves a blanket deposition of the Si:C layer. The blanket deposition is followed by etching so that single crystalline Si:C remains in the recessed source/drain regions 20. An embodiment of such a process is illustrated by the sequence shown in FIGS. 8A-8C. FIG. 8A is identical to the structure shown in FIG. 4 and may be formed in the same manner. FIG. 8B shows the result of a blanket deposition process in which a heteroepitaxial Si:C film 30 fills the source/drains regions 20, and in which a polycrystalline Si:C film 30a is deposited over the field isolation regions 12 and the gate electrode 16. The methods described above for depositing a single crystalline silicon film that comprises substitutional carbon may be employed to deposit the single crystalline Si:C film 30 and the polycrystalline Si:C film 30a. The single crystalline Si:C film 30 can be deposited under conditions that maintain stress. As discussed above, the smaller lattice constant of the Si:C material filling the source/drain recesses exerts tensile strain on the channel region 22 therebetween.

Figure 8C:
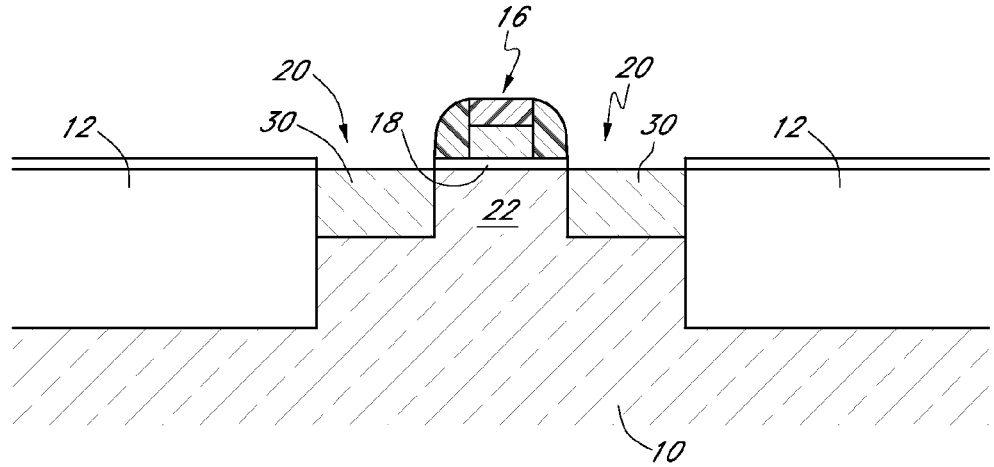

FIG. 8C is similar to FIG. 5 above, except that the depicted structure results from removing the polycrystalline Si:C film 30a using etching conditions that are selective for the removal of polycrystalline material against single crystal material. Such etching conditions are known to those skilled in the art. For example, the skilled artisan will appreciate that a silicon etch can be utilized to selectively remove the polycrystalline material relative to single crystal material.

It will be appreciated that the various Si:C films 30, 32, 34 (FIGS. 5, 6, 7 and 8A-8C) can be implanted or doped with electrical dopants, which can be used to increase electrical conductivity. For example, the Si:C films 30, 32, 34 can be implanted with dopants after their formation. The Si:C films 30, 32, 34 can then be annealed for dopant activation, which has advantages for improvements in the properties of the films, as known in the art. It will be appreciated that such formation of an undoped Si:C film, with subsequent implantation and anneal, can be advantageous in applications in which different degrees and/or types of doping are desired for different parts of the Si:C film. For example, in CMOS applications where the Si:C film is used as a sacrificial cap layer, the film can be separately implanted with P-type (e.g., phosphorus) and N-type (e.g., boron) dopants over PMOS and NMOS areas, respectively.

In other embodiments, the Si:C films 30, 32, 34 can be doped as they are deposited. For example, an electrical dopant precursor can be added to the reactant flow, in addition to the trisilane and carbon source. Preferably, the electrical dopant precursor is a hydride such as arsine or phosphine. The electrical dopant precursor flow rate is typically in the range of from between about 5 sccm and about 500 sccm, depending on the nature of the dopant source and the relative flow rates of the other components. For example, for phosphorus doping, dopant hydride (precursor) flow rates are preferably between about 10-200 sccm of phosphine (1% $PH_3$ in $H_2$).

The portions of the Si:C films (FIGS. 5 to 8C) for forming a silicide preferably have a thickness of about 10 nm or greater, more preferably, about 20 nm or greater and, most preferably, about 20-200 nm.

Figure 9:
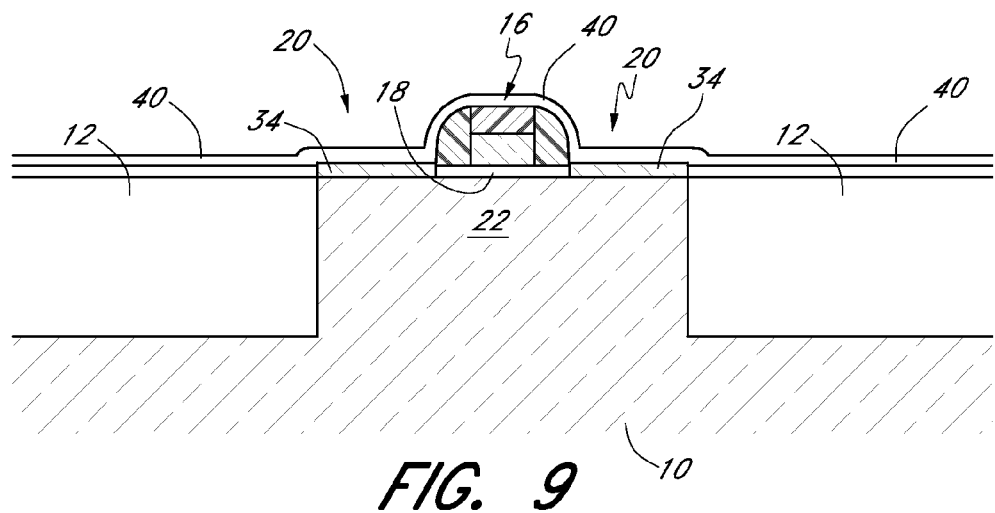
FIG. 9 shows the structure of FIG. 7 after depositing a blanket metal layer, in accordance with some embodiments of the invention.

Next, a metal film, preferably a nickel film, is deposited directly on the Si:C. FIG. 9 shows the structure of FIG. 7 after blanket deposition of a nickel film 40. The nickel film 40 can be deposited by various methods known in the art, including PVD. The deposition preferably forms a nickel film 40 having a thickness of about 10 nm or greater, more preferably, about 10-20 nm.

Figure 10:
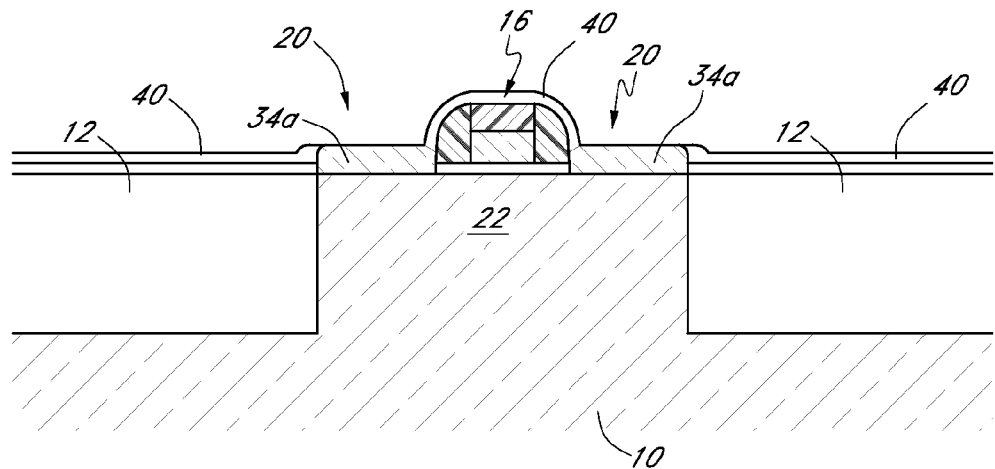
FIG. 10 shows the structure of FIG. 9 after reacting the metal layer with the elevated source/drain regions to form a metal silicide, in accordance with some embodiments of the invention.

FIG. 10 shows the nickel film 40 and the Si:C film 34 after a silicidation reaction to form a carbon-doped metal silicide film 34a. The silicidation is caused by annealing the films 34, 40. The anneal temperature is preferably about 300-600° C. and, in some embodiments, about 400-600° C.

Figure 11:
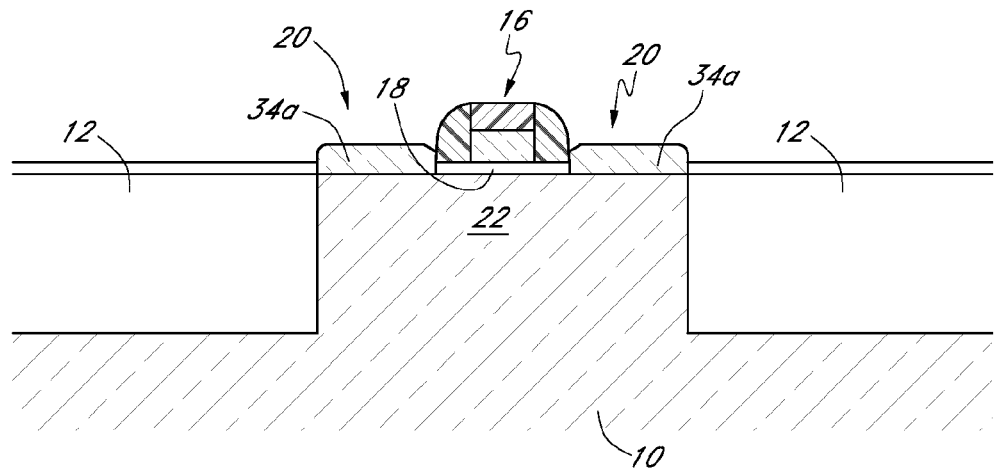
FIG. 11 shows the structure of FIG. 10 after selectively removing unreacted portions of the metal layer, in accordance with some embodiments of the invention.

With reference to FIG. 11, a selective metal etch is used to remove unreacted portions of the metal film 40. It will be appreciated that the etch, such as a wet HCl etch or the like, is selective for the unreacted nickel metal relative to the NiSi:C film 34a. Because no mask was used to remove the metal, the resultant silicide film 34a is often referred to as a "self-aligned silicide" or "salicide" for short.

Figure 12:
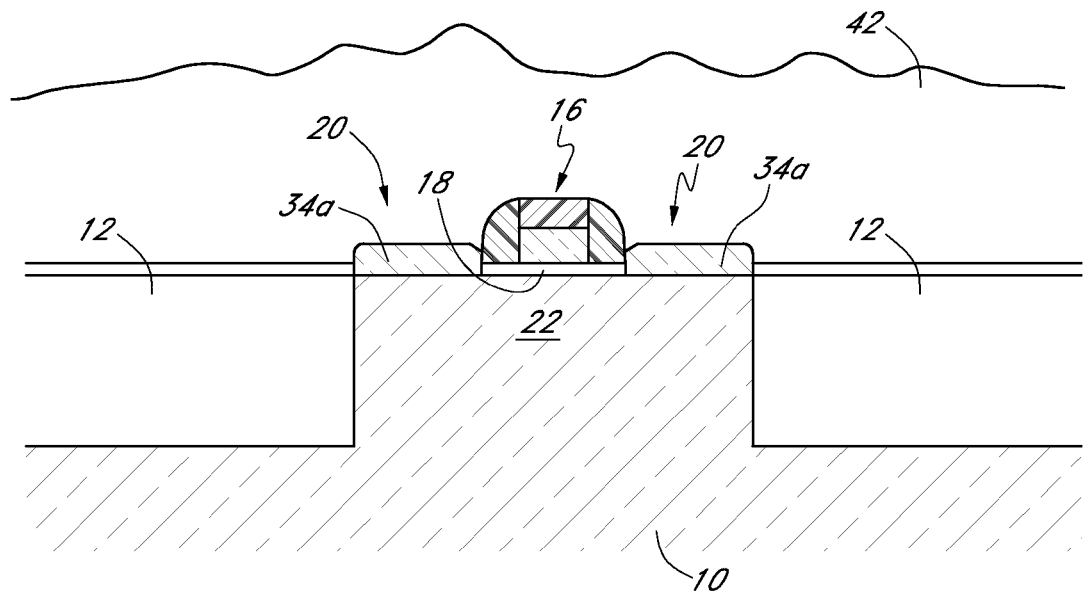
FIG. 12 shows the structure of FIG. 11 after depositing a blanket layer of BPSG, in accordance with some embodiments of the invention.

FIG. 12 shows the structure of FIG. 11 after a BPSG deposition to form BPSG layer 42. As illustrated, it will be appreciated that BPSG layers typically have an uneven surface after being formed.

Figure 13:
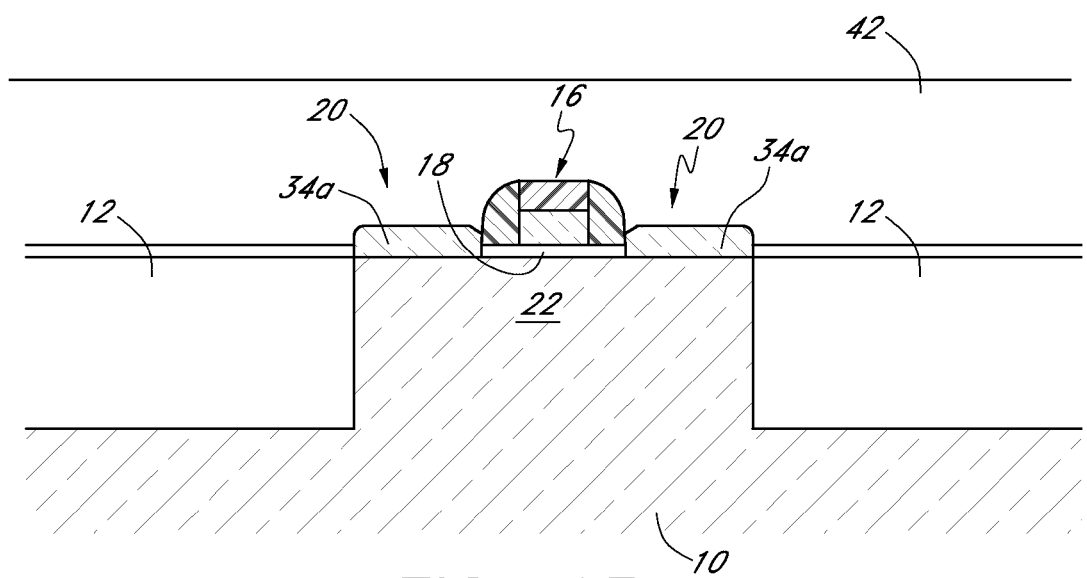
FIG. 13 shows the structure of FIG. 12 after planarizing the blanket layer of BPSG using a reflow anneal, in accordance with some embodiments of the invention.
Figure 14:
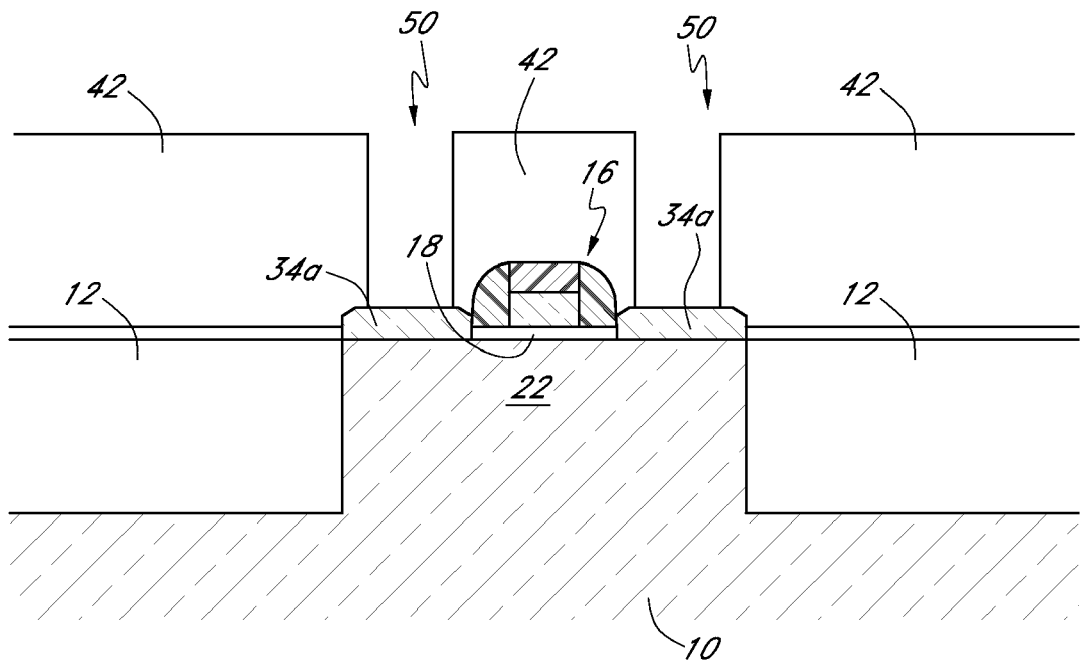
FIG. 14 shows the structure of FIG. 12 after patterning the BPSG layer, in accordance with some embodiments of the invention.

With reference to FIG. 13, the surface of the BPSG layer 42 is planarized by exposure to a high temperature which causes the BPSG to reflow. The planarization is preferably accomplished by annealing the BPSG layer 42 at a temperature of about 700-900° C. The NiSi:C film 34a is thermally stable at the anneal temperature. The NiSi:C film 34a is resistant to phase change at the anneal temperature and its sheet resistance remains at a low level.

It will be appreciated that the BPSG layer 42 can be subjected to subsequent processing after planarization. For example, with reference to FIG. 14, the BPSG layer 42 can be patterned, e.g., to define holes 50 for forming contacts to the NiSi:C film 34a. It will also be appreciated that additional electrical devices and metallization layers can be formed over the BPSG layer 42 to form a complete integrated circuit.

Figure 15:
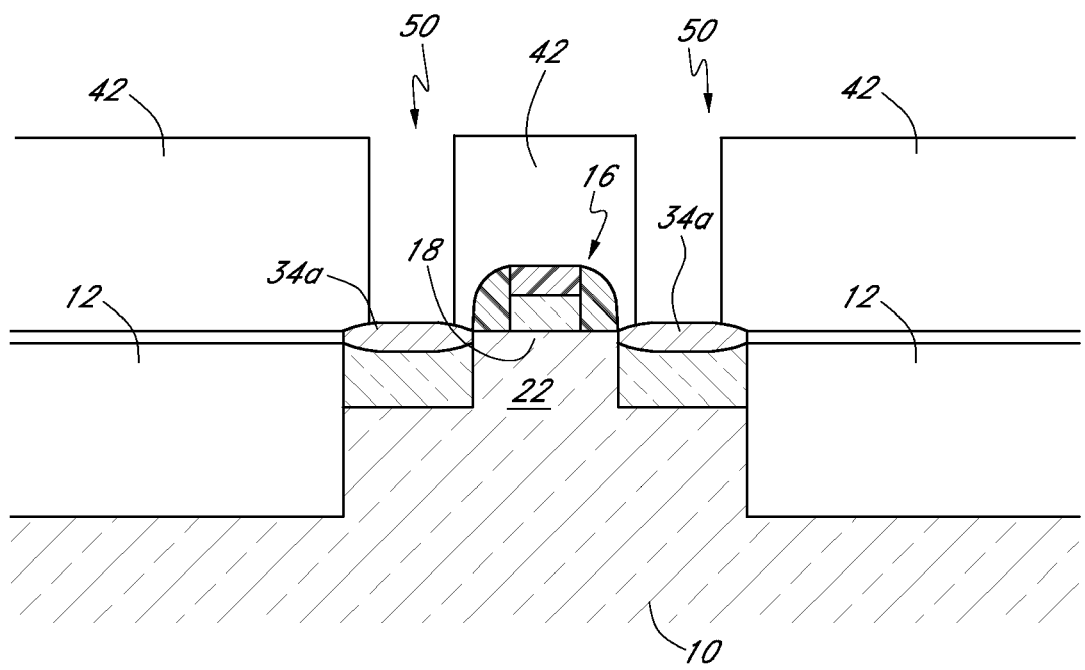
FIG. 15 shows the structure of FIG. 5 or 8C after selective deposition of a semiconductor film within the recessed regions, formation of a metal silicide, deposition and planarization of a BPSG layer, and patterning of the BPSG layer, in accordance with some embodiments of the invention.

As noted above, the Si:C film to be silicided can take various forms. See, e.g., FIGS. 5-8C above. Any of those films can be subjected to the silicidation and subsequent processing steps noted above. For example, FIG. 15 shows the structure of FIGS. 5 and 8C after silicidation, deposition and planarization of the BPSG layer 42, and subsequent patterning of the BPSG layer 42. As illustrated in both FIGS. 14 and 15, the contact holes 50 are typically narrower than the width of the previously formed salicide 34a.

Without being limited by theory, it is believed that carbon in NiSi grains and/or on NiSi grain boundaries and/or on NiSi/Si interfaces blocks phase changes in the NiSi, thereby resulting in the high thermal stability exhibited by the NiSi:C disclosed herein. It will be appreciated that the thermal stability enhancement of carbon can be advantageously applied to many silicides, including, e.g., silicides of titanium or cobalt.

Moreover, while illustrated in the context of forming contacts to source/drain regions of a transistor, the carbon-doped silicide and methods described herein have application to various other contexts in which silicides, particularly self-aligned silicides, are utilized. For example, the silicides discussed herein can be employed in the formation of capacitors or landing pads.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method for semiconductor processing, comprising:
    forming a silicon film comprising at least about 2 atomic % carbon on a substrate by flowing trisilane into a reaction chamber containing the substrate at less than about 600° C., wherein the silicon film comprising at least about 2 atomic % carbon has a substantially uniform composition, wherein the silicon film is deposited at a rate of about 5 nm per minute or higher;
    depositing a metal film on and in contact with the silicon film;
    annealing the metal film and the silicon film to form a metal silicide;
    depositing a dielectric layer above the metal silicide; and
    planarizing the dielectric layer by annealing the dielectric layer at about 800° C. or more, wherein a sheet resistance of the metal silicide is less than about 12 Ohm/sq after annealing the dielectric layer.

2. The method of claim 1, wherein the dielectric layer is a BPSG layer, wherein planarizing the dielectric layer comprises reflowing BPSG.

3. The method of claim 2, further comprising patterning the BPSG layer.

4. The method of claim 1, wherein depositing the metal film comprises depositing a nickel film.

5. The method of claim 1, wherein the silicon film comprises about 2.7 atomic % or more carbon.

6. The method of claim 1, wherein the silicon film is a single crystalline silicon film.

7. The method of claim 6, wherein the carbon is substitutionally doped into the single crystalline silicon film.

8. The method of claim 1, wherein a sheet resistance of the metal silicide as a function of temperature is substantially constant after an anneal at any temperature from about 800-900° C.

9. The method of claim 1, wherein a critical dimension of the metal silicide is less than about 45 nm.

10. The method of claim 1, wherein forming a silicon film comprises selectively depositing the silicon film.

11. The method of claim 10, wherein selectively depositing the silicon film comprises:
    forming one or more recesses in the substrate; and
    selectively depositing the silicon film comprising about 2 atomic % or more carbon into the one or more recesses.

12. The method of claim 1, wherein forming the silicon film comprises flowing a carbon precursor into the reaction chamber, wherein the carbon precursor is selected from the group consisting of monosilylmethane, disilylmethane, trisilylmethane and tetrasilylmethane, and/or alkylsilanes such as monomethyl silane (MMS), dimethyl silane and $H_3Si$—$CH_2$—$SiH_2$—$CH_3$ (1,3-disilabutane).

13. The method of claim 1, further comprising doping the silicon film with an electrical dopant before annealing the metal film and the silicon film to form the metal silicide.

14. The method of claim 13, wherein doping the silicon film with the electrical dopant comprises:
    implanting the electrical dopant after forming the silicon film; and
    subsequently annealing the silicon film.

15. The method of claim 13, wherein doping the silicon film with the electrical dopant comprises flowing a dopant precursor into the reaction chamber while forming the silicon film.

16. The method of claim 13, wherein the electrical dopant is a hydride.

17. The method of claim 13, wherein the electrical dopant is chosen from the group consisting of arsine, phosphine and diborane.

18. The method of claim 1, wherein the reaction chamber is a single substrate, laminar flow, cold wall chamber.

19. The method of claim 1, wherein the silicon film is deposited at a rate of about 400 Å per minute or higher.

20. The method of claim 1, wherein forming the silicon film is performed under mass transport limited deposition conditions.

21. The method of claim 1, wherein the silicon film is deposited at a rate of about 10 nm per minute or higher.

22. The method of claim 1, wherein the silicon film is deposited at a rate of about 20 nm per minute or higher.

23. A method for semiconductor processing, comprising:
    providing a substrate having a silicon film doped with carbon, wherein the silicon film is formed with trisilane as a silicon precursor, wherein the silicon film is doped with 2 atomic % or more carbon, wherein the silicon film doped with carbon has a substantially uniform composition, wherein the silicon film is deposited at a rate of about 5 nm per minute or higher;
    depositing nickel on and in contact with the silicon film;
    reacting the silicon film with the nickel to form a nickel silicide; and
    subsequently annealing the nickel silicide at about 800° C. or more, wherein a sheet resistance of the nickel silicide is less than about 12 Ohm/sq after annealing the nickel silicide.

24. The method of claim 23, wherein the silicon film is doped with 2.7 atomic % or more carbon.

25. The method of claim 23, wherein the silicon film is substitutionally doped with carbon.

26. The method of claim 23, wherein annealing the nickel silicide is performed at about 850° C. or more.

27. The method of claim 26, wherein annealing the nickel silicide is performed at about 900° C. or more.

28. The method of claim 23, wherein reacting the silicon film with nickel comprises annealing the substrate.

29. The method of claim 28, wherein annealing the substrate comprises heating the substrate to a silicidation temperature of about 300-600° C.

30. The method of claim 28, wherein depositing nickel comprises blanket depositing a nickel layer.

31. The method of claim 30, further comprising selectively removing nickel relative to nickel silicide after reacting the silicon film with nickel to form the nickel silicide.

32. The method of claim 23, wherein the silicon film comprises an electrical dopant.

33. The method of claim 32, wherein the electrical dopant is an n-type dopant.

34. The method of claim 23, wherein the silicon film is provided immediately adjacent a gate electrode of a transistor.

35. The method of claim 34, wherein the nickel silicide forms contacts for source/drain regions of the transistor.

36. The method of claim 23, wherein the silicon film is deposited at a rate of about 20 nm per minute or higher.

37. The method of claim 23, wherein the silicon film is deposited at a rate of about 20 nm per minute or higher.

* * * * *

UNITED STATES PATENT AND TRADEMARK OFFICE
CERTIFICATE OF CORRECTION

PATENT NO. : 8,367,548 B2
APPLICATION NO. : 12/035373
DATED : February 5, 2013
INVENTOR(S) : Machkaoutsan et al.

It is certified that error appears in the above-identified patent and that said Letters Patent is hereby corrected as shown below:

Title Page:

In Item 56, on page 2, column 2, line 49, under the heading "Other Publications," please change "HCl" to -- HCl --.

In Item 56, on page 2, column 2, line 55, under the heading "Other Publications," please change "$Si_{1-y}C_y$" to -- $Si_{1-y}C_y$ --.

In the Claims:

In Claim 36, column 14, line 14, please change "20" to -- 10 --.

Signed and Sealed this
Fifth Day of November, 2013

Teresa Stanek Rea
*Deputy Director of the United States Patent and Trademark Office*